(12) United States Patent  (10) Patent No.: US 6,296,520 B1
Horng  (45) Date of Patent: Oct. 2, 2001

(54) MODIFIED STRUCTURE FOR PREVENTING ELECTROMAGNETIC INTERFERENCE OF CENTRAL PROCESSING UNIT

(76) Inventor: Chin Fu Horng, No. 9, Lane 90, Fu Hsing Rd., Lu Chou, Taipei Hsien (TW)

( * ) Notice: Subject to any disclaimer, the term of this patent is extended or adjusted under 35 U.S.C. 154(b) by 0 days.

(21) Appl. No.: 09/562,630

(22) Filed: May 2, 2000

(51) Int. Cl.⁷ .................................................. H01R 13/648
(52) U.S. Cl. ............................................. 439/607; 439/71
(58) Field of Search ............................... 439/607, 71–72, 439/73, 485, 344, 342, 152, 331, 487; 361/386–389, 735, 809, 820, 703–705, 709, 710, 712

(56) References Cited

U.S. PATENT DOCUMENTS

| | | | |
|---|---|---|---|
| 5,357,404 | * 10/1994 | Bright et al. | 361/818 |
| 5,384,692 | * 1/1995 | Jaff | 361/807 |
| 5,485,351 | * 1/1996 | Hopfer et al. | 439/331 |
| 5,602,719 | * 2/1997 | Kinion | 361/704 |
| 5,647,756 | * 7/1997 | Twigg et al. | 439/331 |
| 5,648,890 | * 7/1997 | Leo et al. | 361/704 |
| 5,648,893 | * 7/1997 | Leo et al. | 361/820 |
| 6,071,128 | * 6/2000 | Brewington et al. | 439/73 |

* cited by examiner

Primary Examiner—Brian Sircus
Assistant Examiner—J. F. Duverne

(57) ABSTRACT

The present invention proposes a modified structure for preventing EMI of a CPU. The proposed modified structure comprises a base, a shielding element, two first pins, and two second pins. A CPU can be mounted in the base. Two first pin sockets are installed at one side of the base, and two second pin sockets are installed at the other side of the base. Pin-receiving holes are disposed on each of the pin sockets. Pivot joints are installed at one side of the shielding element, and lapping parts are installed at the other side of the shielding element. Each first pin has a main body extending to form a plugging part. The plugging parts of the first pins are plugged in the pin-receiving holes of the first pin sockets of the base. Each second pin has a main body extending to form a plugging part. The plugging parts of the second pins are plugged in the pin-receiving holes of the second pin sockets of the base. The shielding element can be closed or unfolded. When the shielding element is closed, it can cover over the CPU with lapping parts at one side thereof lapping on the main body of the second pin. Through the contact of the first pins and the second pins with the motherboard to acquire electrically grounding function, the shielding element can provide good electromagnetic shielding effect. Better shielding effect of EMI for the CPU can thus be achieved. Moreover, the assembly of the shielding element is timesaving and laborsaving. Manpower can be greatly saved so that production cost can be effectively reduced. Additionally, the disassembly of the shielding element is a very simple operation.

8 Claims, 7 Drawing Sheets

MODIFIED STRUCTURE FOR PREVENTING ELECTROMAGNETIC INTERFERENCE OF CENTRAL PROCESSING UNIT

FIELD OF THE INVENTION

The present invention relates to a modified structure for preventing electromagnetic interference of a central processing unit and, more particularly, to a modified structure for preventing electromagnetic interference of a central processing unit, which not only can achieve better electromagnetic shielding effect, but also can be assembled and disassembled easily. Moreover, production cost of the proposed structure can be greatly reduced.

BACKGROUND OF THE INVENTION

The central processing unit (CPU) is the center of a computer. It processes data transferring from various kinds of devices, and transfers data to correct devices for executing after some judgments and calculations. Therefore, the CPU can be said to be the brain of a computer.

To prevent the electromagnetic interference (EMI) from affecting the operation of a CPU, there is already a kind of structure commercially available for preventing the EMI of a CPU. As shown in FIG. 1, a CPU 10a is mounted in a base 11a. The base 11a is then mounted in a motherboard 12a so that the CPU 10a can be fixed on the motherboard 12a. A shielding element 13a made of metal material is installed above the CPU 10a. The shielding element 13a is a rectangular plate with an opening 14a at the center thereof. Each corner of the shielding element 13a extends downwards to form a pin 15a having a reverse hook, as shown in FIG. 1A. The shielding element 13a covers over the CPU 10a with the four pins 15a mounted in corresponding connection holes 16a preset on the motherboard 12a so that the shielding element 13a can also be steadily positioned on the motherboard 12a, thereby providing electromagnetic shielding effect for the CPU 10a.

The top of the CPU 10a contacts with the bottom of a heat radiator 17a through the opening 14a of the shielding element 13a. A retaining element 18a is installed above the heat radiator 17a. The two ends of the retaining element 18a are fastened at the two sides of the base 11a so that the heat radiator 17a can be fixed on the CPU 10a. The heat generated by the CPU 10a can thus be conducted to the heat radiator 17a for increasing heat-radiating effect.

However, the shielding element 17a in prior art uses the pins 15a having reverse hooks to be hooked on the motherboard 12a. There is no electrically grounding function. Therefore, better shielding effect of EMI can not be achieved.

Moreover, when the shielding element 13a in prior art is to be assembled on the CPU 10a, it is necessary to align the four pins 15a of the shielding element 13a with the four connection holes 16a on the mother board 12a so as to successfully insert the four pins 15a in the four connection holes 16a. The operation is laborsome and time-consuming, resulting in inconvenience of the assembly of the shielding element 13a. More manpower will be wasted so that production cost can not be effectively reduced. Moreover, because the four pins 15a of the shielding element 13a have reverse hooks, it is difficult to dismount the shielding element 13a when the pins 15a are hooked in the connection holes 16a, resulting in inconvenience of the disassembly of the shielding element 13a.

SUMMARY AND OBJECTS OF THE PRESENT INVENTION

The primary object of the present invention is to provide a modified structure for preventing EMI of a CPU. The proposed modified structure comprises a base, a shielding element, two first pins, and two second pins. A CPU can be mounted in the base. Two first pin sockets are installed at one side of the base, and two second pin sockets are installed at the other side of the base. The first pins are pivotally connected to pivot joints at one side of the shielding element. The first pins are plugged in the first pin sockets of the base, and the second pins are plugged in the second pin sockets of the base. The shielding element can be closed or unfolded. When the shielding element is closed, it can cover over the CPU with lapping parts at one side thereof lapping on the second pins. The shielding element of the present invention uses the pivot joints and the lapping parts to contact with the first pins and the second pins. Moreover, the first pins and the second pins can be mounted in the motherboard. Through the contact of the first pins and the second pins with the motherboard to acquire electrically grounding finction, the shielding element can provide good electromagnetic shielding effect. Better shielding effect of EMI for the CPU can thus be achieved.

Another object of the present invention is to provide a modified structure for preventing EMI of a CPU, wherein a shielding element is pivotally connected to a base. When the base is mounted in a motherboard, first pins and second pins are also mounted in connection holes of the motherboard. The assembly of the shielding element is timesaving and laborsaving. Manpower can be greatly saved so that production cost can be effectively reduced. Moreover, because the shielding element is pivotally connected to the base, the assembly and disassembly of the CPU can be facilitated when the shielding element is unfolded. The shielding element can be dismounted when the first pins are drawn out from the first pin sockets. The disassembly of the shielding element is thus a very simple operation.

The various objects and advantages of the present invention will be more readily understood from the following detailed description when read in conjunction with the appended drawings, in which:

DETAILED DESCRIPTION OF PREFERRED EMBODIMENT

Figure 1:
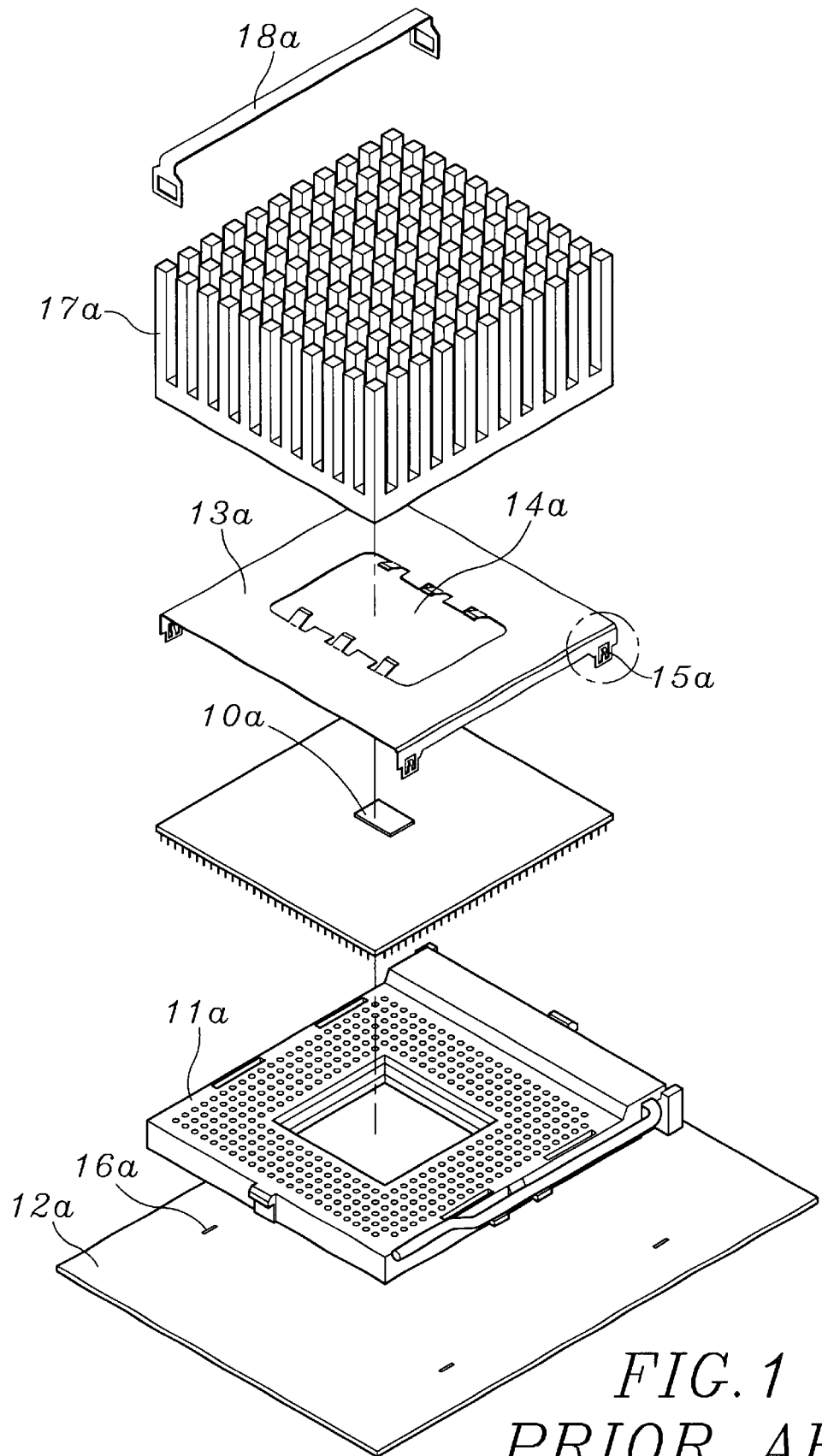
FIG. 1 is an exploded perspective view of a structure for preventing EMI of a CPU in prior art.
Figure 1A:
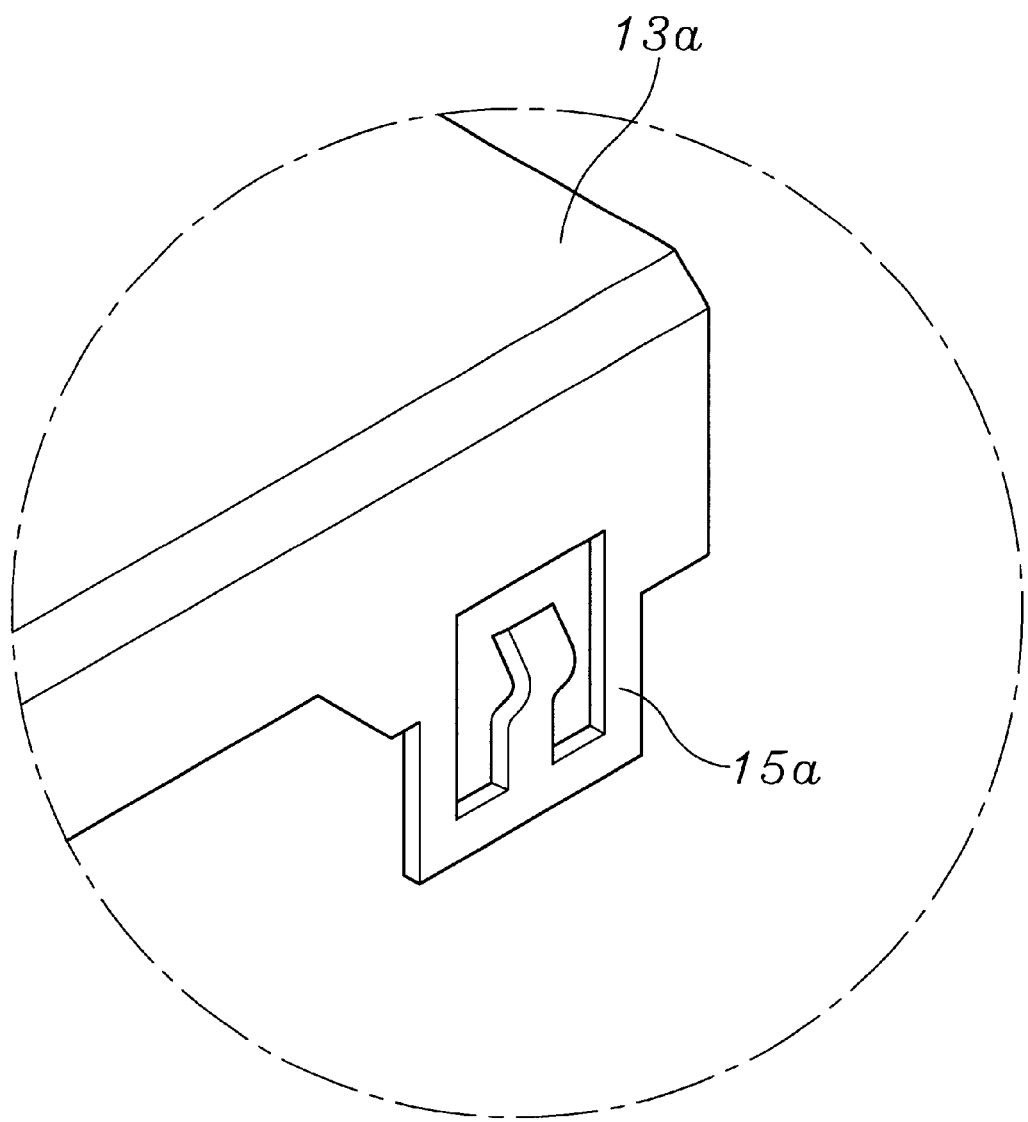
FIG. 1A is a locally enlarged view of FIG. 1.
Figure 2:
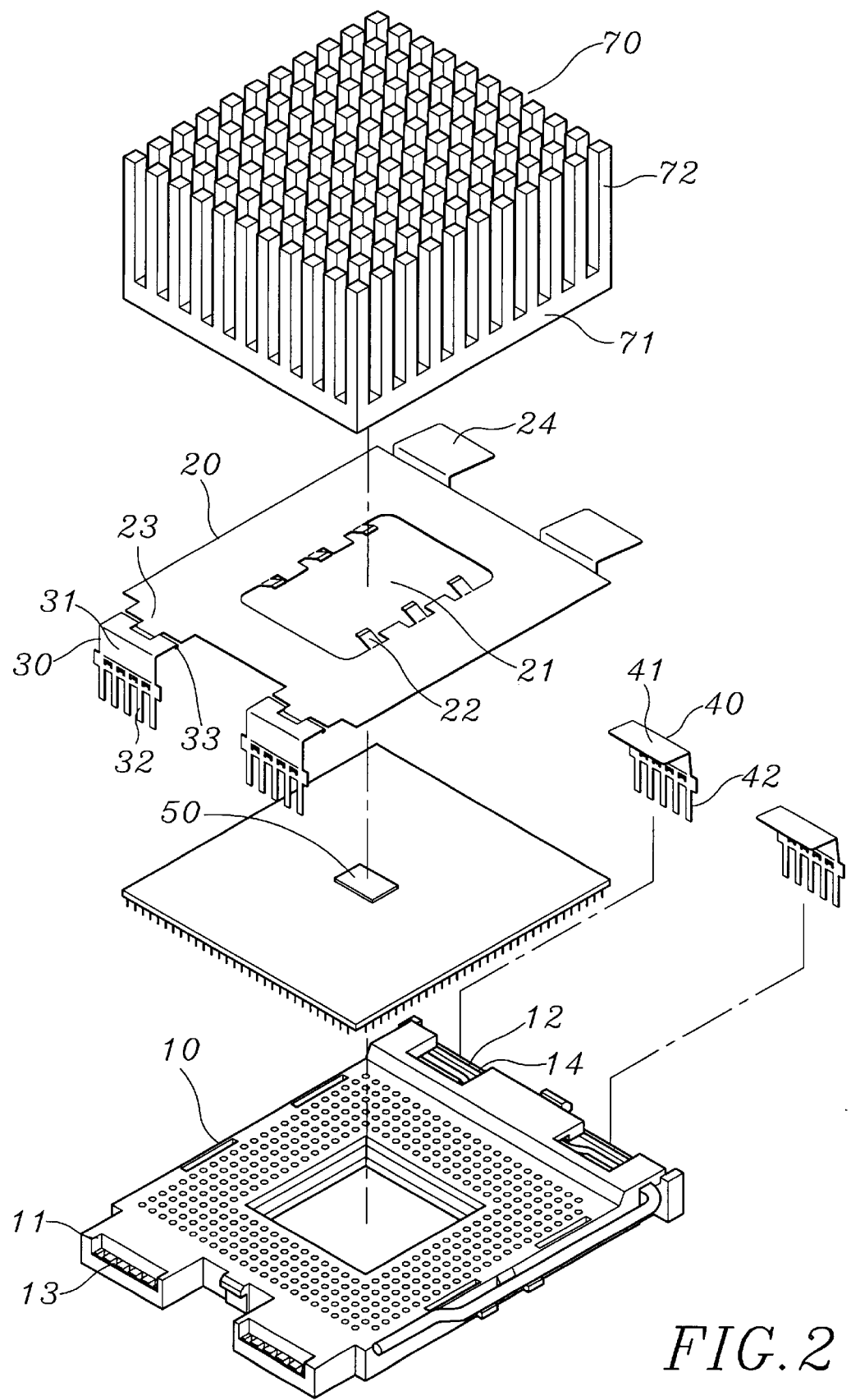
FIG. 2 is an exploded perspective view of the present invention.
Figure 3:
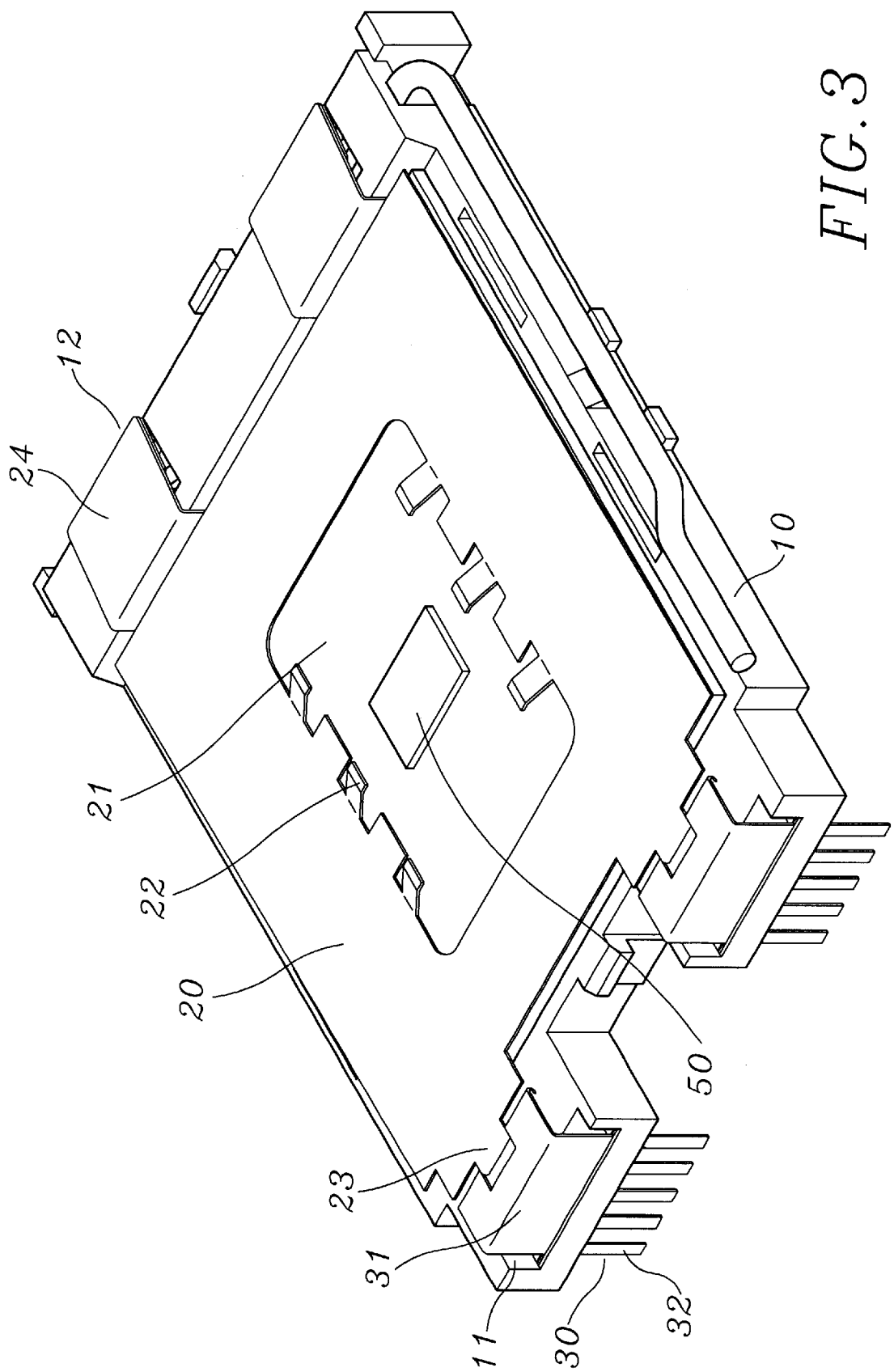
FIG. 3 is a perspective view of the present invention.
Figure 4:
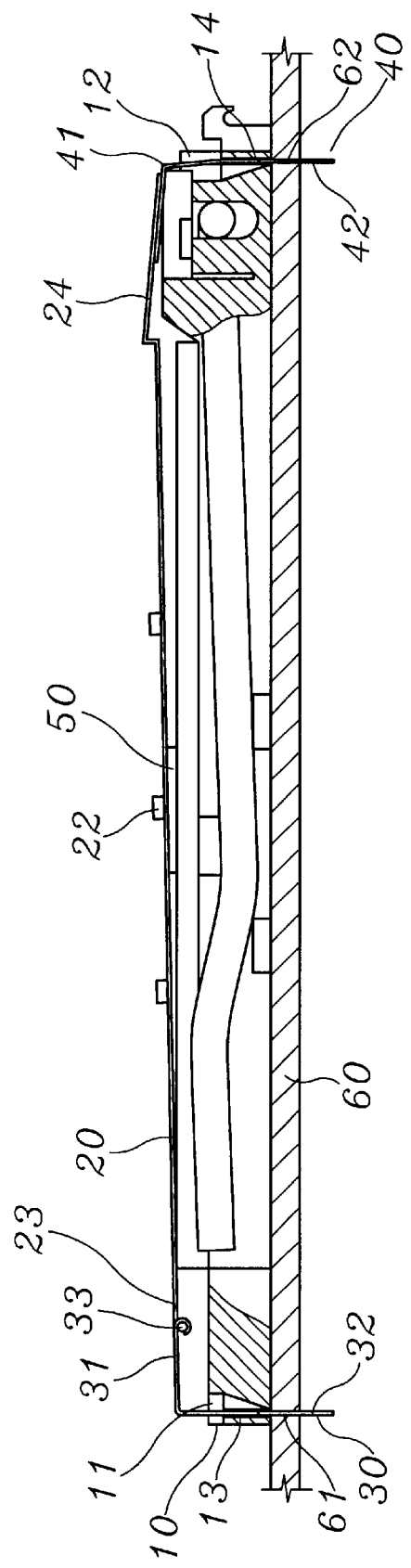
FIG. 4 is a cross-sectional view of the present invention.

As shown in FIGS. 2 to 4, the present invention provides a modified structure for preventing EMI of a CPU. The proposed modified structure comprises a base 10, a shielding element 20, two first pins 30, and two second pins 40. The base 10 is a general zero-insertion-force (ZIF) connector, which is a well-known structure in prior art and thus will not be further described. The present invention is characterized in that two first pin sockets 11 are installed at one side of the base 10 and two second pin sockets 12 are installed at the other side of the base 10. A plurality of pin-receiving holes 13 and 14 penetrating from top to bottom are disposed on the pin sockets 11 and 12, respectively.

The shielding element 20 is made of resilient metal material. The shielding element 20 is a rectangular plate with an opening 21 at the center thereof. A plurality of resilient leaves 22 projecting upwards are installed at the edge of the opening 21. One end of each of the resilient leaf 22 forms a free end. Two pivot joints 23 are installed at one side of the shielding element 20. The two pivot joints 23 correspond to the two first pin sockets 11 of the base 10. Two lapping parts 24 are installed at the other side of the shielding element 20. The two lapping parts 24 are higher than the shielding element 20 and are slanting. The two lapping parts 24 correspond to the two second pin sockets 12 of the base 10.

The first pins 30, each having a main body 31, are made of metal material. The main body 31 is properly bent. The bottom end of the main body 31 extends to form a plurality of plugging parts 32. The top end of the main body 31 of each of the first pin 30 is pivotally connected to one of the two pivot joints 23 of the shielding element 20 via a pivot 33 so that the two first pins 30 are pivotally connected to one side of the shielding element 20. The plugging parts 32 of the two first pins 30 are then mounted in the pin-receiving holes 13 of the two first pin sockets 11 of the base 10. The bottom ends of the plugging parts 32 of the two first pins 30 protrude out of the bottom of the base 10 a certain length. The shielding element 20 can thus be closed or unfolded with the pivots 33 as the axis.

The second pins 40, each having a main body 41, are made of metal material. The main body 41 is properly bent and is slanting. The bottom end of the main body 41 extends to form a plurality of plugging parts 42. The plugging parts 42 of the two second pins 40 are then mounted in the pin-receiving holes 14 of the two second pin sockets 12 of the base 10. The bottom ends of the plugging parts 42 of the two second pins 40 protrude out of the bottom of the base 10 a certain length. A modified structure for preventing EMI of a CPU according to the present invention is thus formed.

As shown in FIGS. 3 and 4, a CPU 50 can be mounted in the base 10. The shielding element 20 is then closed with the pivots 33 as the axis so that the shielding element 20 covers over the CPU 50. The shielding element 20 can thus provide electromagnetic shielding effect for the CPU 50. The two lapping parts 24 at the free end of the shielding element 20 lap on the main bodies 41 of the two second pins 40. When the base (connector) 10 is mounted in a motherboard 60, the plugging parts 32 and 42 of the two first pins 30 and the two second pins 40 can be plugged in corresponding connection holes 61 and 62 preset on the motherboard 60, respectively. The two first pins 30 and the two second pins 40 can thus contact with the motherboard 60, and the plugging parts 32 and 42 can be properly soldered to the motherboard 60.

Figure 5:
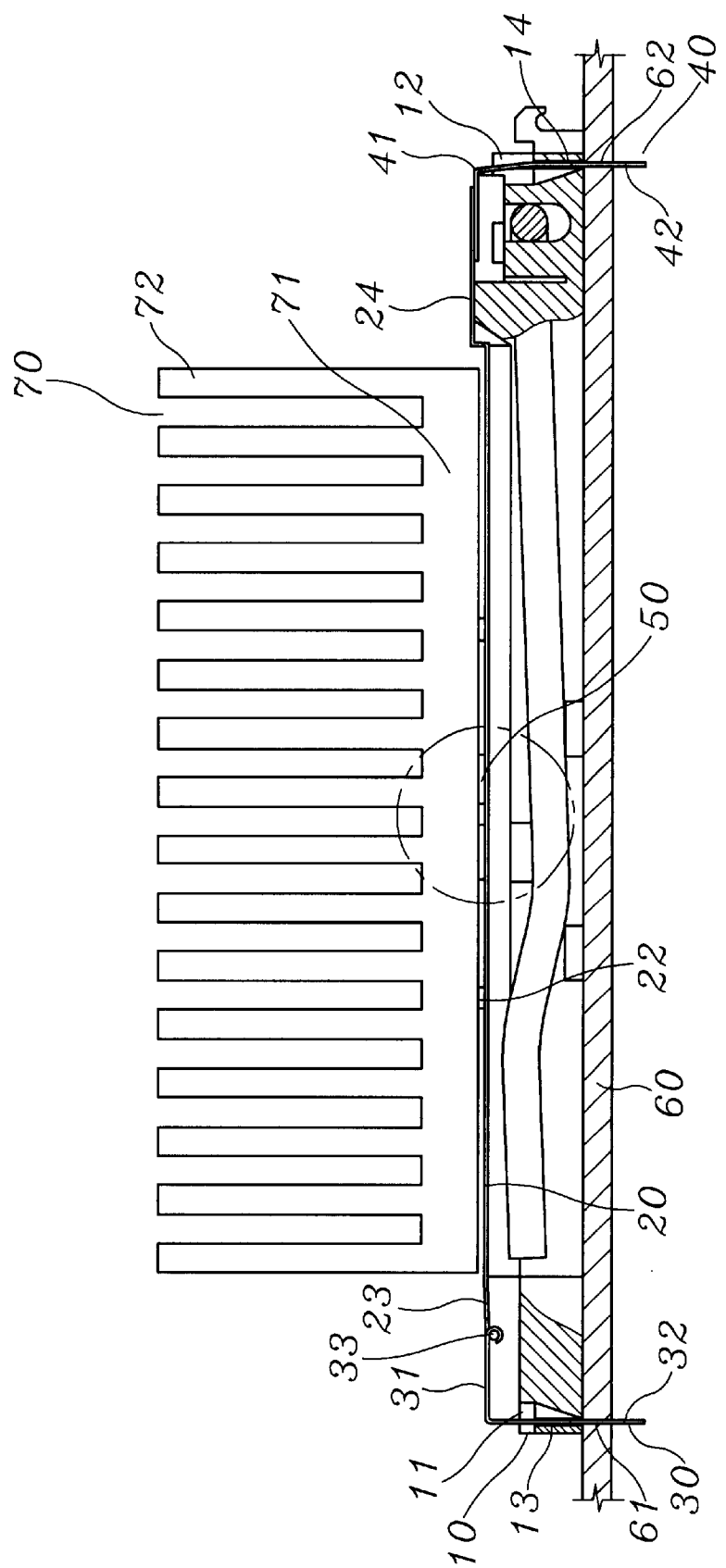
FIG. 5 is a cross-sectional view of the present invention with a heat radiator attached.
Figure 5A:
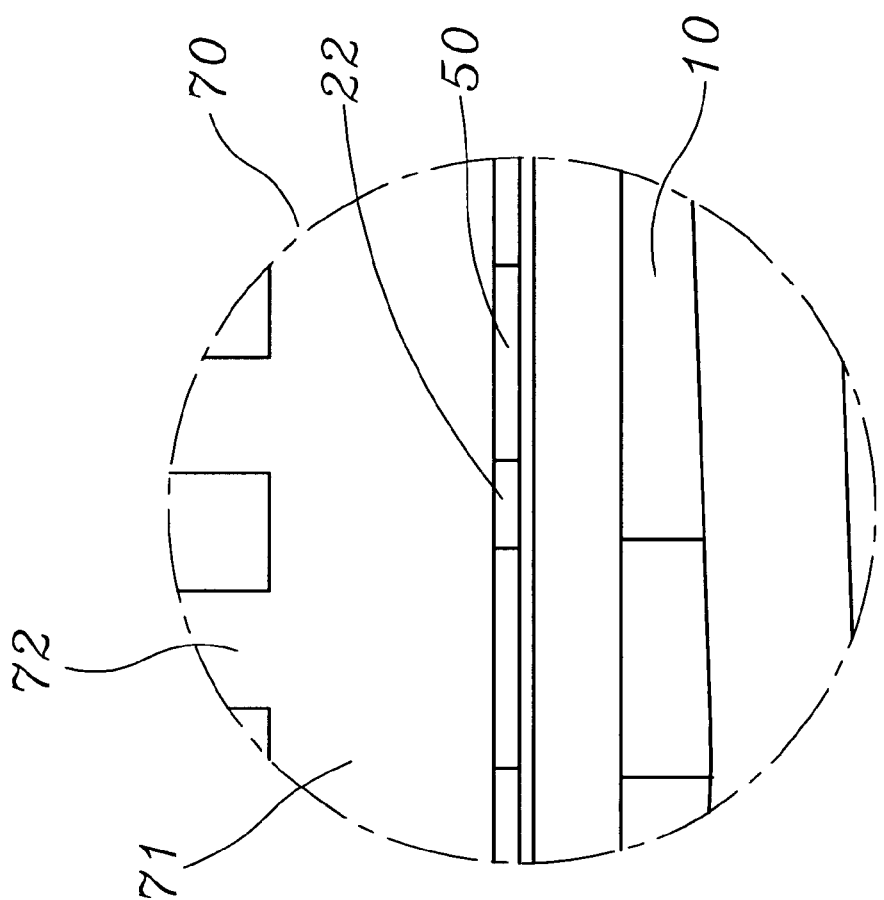
FIG. 5A is a locally enlarged view of FIG. 5.

As shown in FIGS. 5 and 5A, a general heat radiator 70 can be installed above the shielding element 20. The heat radiator 70 comprises a bottom board 71 and a plurality of fins 72. The fins 72 are alternately spaced and are connected to the bottom board 71. The top of the CPU 50 contacts with the bottom the heat radiator 70 through the opening 21 of the shielding element 20. The heat radiator 70 can be fastened via a retaining element (not shown) so that heat generated by the CPU 50 can be conducted to the heat radiator 70 for increasing heat-radiating effect. Moreover, the heat radiator 70 can press on the resilient leaves 22 of the shielding element 20 so that the shielding element 20 can stick tightly to the CPU 50.

The shielding element 20 of the present invention uses the pivot joints 23 and the lapping parts 24 at the two sides thereof to contact with the first pins 30 and the second pins 40. Moreover, the first pins 30 and the second pins 40 are mounted in the motherboard 60. Through the contact of the first pins 30 and the second pins 40 with the motherboard 60 to acquire electrically grounding function, the shielding element 20 can provide good electromagnetic shielding effect. Better shielding effect of EMI for the CPU 50 can thus be achieved.

Additionally, the shielding element 20 of the present invention is pivotally connected to the base 10. When the base 10 is mounted in the motherboard 60, the plugging parts 32 and 42 of the first pins 30 and the second pins 40 are also mounted in the connection holes 61 and 62 of the motherboard 60, respectively. The assembly of the shielding element 20 is timesaving and laborsaving. Manpower can thus be greatly saved so that production cost can be effectively reduced.

Moreover, because the shielding element 20 of the present invention is pivotally connected to the base 10, it can be unfolded to facilitate the assembly and disassembly of the CPU 50. The shielding element 20 can be dismounted when the first pins 30 are drawn out from the first pin sockets 13. The disassembly of the shielding element 20 is thus a very simple operation.

Because the shielding element 20 of the present invention is pivotally connected to the base 10, it can be unfolded to be placed at one side of the base. When the shielding element 20 is to be closed, no searching time will be wasted. Moreover, the situation that the shielding element 20 is lost can be avoided.

Although the present invention has been described with reference to the preferred embodiments thereof, it will be understood that the invention is not limited to the details thereof Various substitutions and modifications have suggested in the foregoing description, and other will occur to those of ordinary skill in the art. Therefore, all such substitutions and modifications are intended to be embraced within the scope of the invention as defined in the appended claims.

I claim:

1. A modified structure for preventing EMI for a CPU, comprising:

a base with first pin sockets installed at one side thereof and second pin sockets installed at another side thereof, pin-receiving holes being disposed on each said pin socket;

a shielding element with pivot joints installed at one side thereof and lapping parts installed at the other side thereof;

at least a first pin having a main body, said main body extending to form plugging parts, said main body of said first pin being pivotally connected to said pivot joints of said shielding element, said plugging parts of said first pin being mounted in said pin-receiving holes of said first pin socket of said base, the bottom end of said plugging parts of said first pin protruding out of the bottom of said base; and at least a second pin having a main body, said main body extending to form plugging parts, said plugging parts of said second pin being mounted in said pin-receiving holes of said second pin socket of said base, the bottom end of said plugging parts of said second pin protruding out of the bottom of said base;

thereby said shielding element can be closed or unfolded and when said shielding element is closed, said lapping parts of said shielding element can lap on said main bodies of said second pins.

2. The modified structure of claim 1, wherein said base is a ZIF connector.

3. The modified structure of claim 1, wherein said shielding element is made of resilient metal material.

4. The modified structure of claim 1, wherein said shielding element has an opening at the center thereof, and a plurality of resilient leaves projecting upwards are installed at the edge of said opening.

5. The modified structure of claim 1, wherein said lapping parts are higher than said shielding element.

6. The modified structure of claim 1, wherein said lapping parts and said main bodies of said second pins are slanting.

7. The modified structure of claim 1, wherein said first pins and said second pins are made of metal material.

8. The modified structure of claim 1, wherein said main bodies of said first pins are pivotally connected to said pivot joints of said shielding element via pivots.

* * * * *